(12) United States Patent
Zou et al.

(10) Patent No.: US 11,297,441 B2
(45) Date of Patent: Apr. 5, 2022

(54) MICROPHONE

(71) Applicants: Goertek, Inc., Weifang (CN); Qingdao Research Institute of Beihang University, Shangdong (CN)

(72) Inventors: Quanbo Zou, Weifang (CN); Qunwen Leng, Weifang (CN); Zhe Wang, Weifang (CN)

(73) Assignees: Goertek, Inc., Weifang (CN); Qingdao Research Institute of Beihang Univerity, Qingdao (CN)

( * ) Notice: Subject to any disclaimer, the term of this patent is extended or adjusted under 35 U.S.C. 154(b) by 233 days.

(21) Appl. No.: 16/640,015

(22) PCT Filed: Sep. 6, 2018

(86) PCT No.: PCT/CN2018/104438
§ 371 (c)(1),
(2) Date: Feb. 18, 2020

(87) PCT Pub. No.: WO2020/000647
PCT Pub. Date: Jan. 2, 2020

(65) Prior Publication Data
US 2020/0236471 A1    Jul. 23, 2020

(30) Foreign Application Priority Data
Jun. 25, 2018  (CN) .......................... 201810662233.6

(51) Int. Cl.
*H04R 19/04*   (2006.01)
*H04R 19/00*   (2006.01)
*H01L 43/08*   (2006.01)

(52) U.S. Cl.
CPC ........... *H04R 19/04* (2013.01); *H04R 19/005* (2013.01); *H01L 43/08* (2013.01)

(58) Field of Classification Search
CPC ...... H04R 19/04; H04R 19/005; H04R 23/00; H04R 2201/003; H01L 43/08
See application file for complete search history.

(56) References Cited

U.S. PATENT DOCUMENTS

| | | |
|---|---|---|
| 2002/0178831 A1 | 12/2002 | Takada |
| 2011/0235829 A1 | 9/2011 | Yang |

(Continued)

FOREIGN PATENT DOCUMENTS

| | | |
|---|---|---|
| CN | 101448193 A | 6/2009 |
| CN | 203554647 U | 4/2014 |
| CN | 104244152 A | 12/2014 |

*Primary Examiner* — Tuan D Nguyen
(74) *Attorney, Agent, or Firm* — Baker Botts L.L.P.

(57) ABSTRACT

The present disclosure discloses a microphone, comprising: a first substrate, the first substrate having an inner cavity open at one end, wherein the microphone further comprises a vibration diaphragm and at least one cantilever which are provided to the first substrate and suspended above the inner cavity. The cantilever is separated from the vibration diaphragm by a spacing portion, and the vibration diaphragm and the inner cavity of the first substrate define an acoustically sealed cavity; and a detection structure is provided to the vibration diaphragm and the cantilever. The structural design of the cantilever is adopted, so that the space between the vibration diaphragm and the cantilever is open, the airflow can smoothly pass by the cantilever, and further the signal-to-noise ratio of the microphone can be greatly improved.

10 Claims, 2 Drawing Sheets

(56) References Cited

U.S. PATENT DOCUMENTS

2014/0319630 A1\* 10/2014 Conti ................... H04R 19/005
257/416
2015/0078592 A1\* 3/2015 Uchida ................ H04R 19/005
381/191
2015/0078593 A1\* 3/2015 Uchida ................ H04R 19/005
381/191

\* cited by examiner

MICROPHONE

CROSS-REFERENCE TO RELATED APPLICATIONS

This application is a National Stage of International Application No. PCT/CN2018/104438, filed on Sep. 6, 2018, which claims priority to Chinese Patent Application No. 201810662233.6, filed on Jun. 25, 2018, both of which are hereby incorporated by reference in their entireties.

TECHNICAL FIELD

The present disclosure relates to the field of acoustic-electric conversion, and more particularly, to a microphone mechanism, especially a microphone structure with a high SNR (signal-to-noise ratio).

BACKGROUND

Currently, prevailing MEMS (micro electro-mechanical systems) microphones each adopt a capacitive sensing structure, comprising a substrate and a backplate and a vibration diaphragm which are formed on the substrate. A gap exists between the backplate and the vibration diaphragm, so that the backplate and the vibration diaphragm form a plate-type capacitor sensing structure, and a cavity is formed between the backplate and the vibration diaphragm. Dense through holes are generally designed in the backplate and the vibration diaphragm for the pressure equalization.

For a microphone with such a structure, the sensitivity of the entire microphone is determined by the mechanical sensitivity of the vibration diaphragm. In manufacturing, due to the limited controllability on the pressure/stress gradients and dimensions, a change in the mechanical properties (such as the mechanical sensitivity, the resonant frequency, and the curvature, etc.) of the vibration diaphragm will cause a change of the overall performance of the device, thereby deteriorate the productivity.

In addition, when the vibration diaphragm vibrates, the air flow resistance in the gap or through holes caused by the air viscosity becomes a dominant factor of the noise of the MEMS microphone, such that the microphone is limited in terms of the signal-to-noise ratio.

SUMMARY

An objective of the present disclosure is to provide a novel technical solution for a microphone.

According to a first aspect of the present disclosure, there is provided a microphone, comprising a first substrate having an inner cavity with an open end; a vibration diaphragm and at least one cantilever which are provided to the first substrate and suspended above the inner cavity, the vibration diaphragm and the inner cavity of the first substrate enclosing an acoustically sealed cavity; a spacing portion separating the cantilever from the vibration diaphragm; and a detection structure provided to the vibration diaphragm and the cantilever, the detection structure being configured to output an electrical signal representing a deformation of the vibration diaphragm.

Preferably, the cantilever is located below the vibration diaphragm, an end of the cantilever is fixed to the first substrate, and the vibration diaphragm is supported above the cantilever by the spacing portion.

Preferably, the cantilever is located above the vibration diaphragm, an edge of the vibration diaphragm is fixed to the first substrate, and an end of the cantilever is supported above the vibration diaphragm by the spacing portion.

Preferably, one end of the cantilever is directly or indirectly connected to the first substrate, and the other end of the cantilever extends toward the central direction of the vibration diaphragm and is suspended in the air.

Preferably, both ends of the cantilever are directly or indirectly connected to the first substrate.

Preferably, the cantilever comprises at least two cantilevers, and the at least two cantilevers are disposed in an intersecting manner.

Preferably, a support portion for supporting the cantilever is formed in the inner cavity of the first substrate, the support portion being shaped and sized to match with the cantilever.

Preferably, the detection structure comprises a magnetic film and a magnetoresistive sensor cooperating with the magnetic film.

The magnetic film is provided on one of the vibration diaphragm and the cantilever, the magnetoresistive sensor is provided on the other one of the vibration diaphragm and the cantilever, and the magnetoresistive sensor is configured to sense a magnetic field change of the magnetic film during a vibration of the vibration diaphragm to output a varying electrical signal.

Preferably, the magnetoresistive sensor is a giant magnetoresistive sensor or a tunnel magnetoresistive sensor.

Preferably, the microphone further comprises a pressure relief hole communicating the acoustically sealed cavity with an ambient environment, the pressure relief hole being an acoustically sealed hole.

The microphone according to the present disclosure eliminates a structure of the backplate, and adopts a structural design of the cantilever, so that a space between the vibration diaphragm and the cantilever is open. When the vibration diaphragm vibrates, the airflow can smoothly pass the cantilever. The airflow resistance in the gap or through holes caused by air viscosity is not present, and the signal-to-noise ratio of the microphone can be greatly improved.

In addition, the vibration diaphragm and the inner cavity of the first substrate enclose the acoustically sealed cavity, and the air elasticity in the acoustically sealed cavity determines the sensitivity of the entire microphone. When such a microphone is manufactured, the consistency of parameters of the acoustically sealed cavity is easy to control, so that the consistency of the sensitivity of the microphone can be guaranteed.

Further features of the present disclosure and advantages thereof will become apparent from the following detailed description of exemplary embodiments according to the present disclosure with reference to the attached drawings.

BRIEF DESCRIPTION OF THE DRAWINGS

The accompanying drawings, which are incorporated in and constitute a part of the specification, illustrate embodiments of the disclosure and, together with the description thereof, serve to explain the principles of the disclosure.

DETAILED DESCRIPTION

Technical problems to be solved, technical solutions to be adopted, and technical effects to be obtained by the present disclosure are to be easily understood from the further detailed description of particular embodiments according to the present disclosure in conjunction with the attached drawings.

Figure 1:
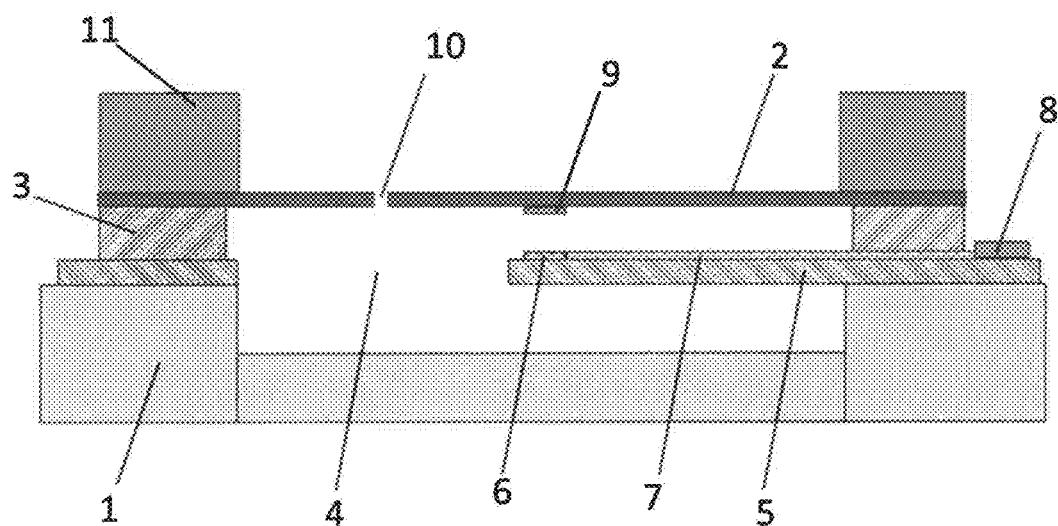
FIG. 1 is a cross-sectional view of a first embodiment of a microphone of the present disclosure.

Referring to FIG. 1, the present disclosure provides a microphone, comprising a first substrate 1, and a vibration diaphragm 2 and at least one cantilever 5 which are provided to the first substrate 1.

The first substrate 1 has an inner cavity with an open end, and an edge of the vibration diaphragm 2 and an end of the cantilever 5 are directly or indirectly connected to the first substrate 1, so that main parts of the vibration diaphragm 2 and the cantilever 5 are suspended above the inner cavity of the substrate 1.

The cantilever 5 and the vibration diaphragm 2 are separated by a spacing portion 3, and the height of the spacing portion 3 forms an initial gap between the vibration diaphragm 2 and the cantilever 5. A detection structure is provided to the vibration diaphragm 2 and the cantilever 5, and the detection structure may comprise, for example, a capacitor, a magnetic sensor, or a floating gate type field-effect transistor. The working principle of such detection structure belongs to the common general knowledge for those skilled in the art, and is not specifically explained herein. When the vibration diaphragm 2 vibrates, the detection structure can output an electrical signal representing a deformation of the vibration diaphragm 2, thereby converting an acoustic signal into the electrical signal.

The microphone according to the present disclosure eliminates the structure of the backplate, and adopts the structural design of the cantilever 5, so that the space between the vibration diaphragm 2 and the cantilever 5 is open, which is totally different from the traditional approximately sealed cavity surrounded between the vibration diaphragm 2 and the backplate. Due to the use of such an open design, when the vibration diaphragm 2 vibrates, airflow can smoothly pass the cantilever 5, and the air flow resistance in the gap or through holes caused by air viscosity is not present, thereby greatly improving the signal-to-noise ratio of the microphone.

The vibration diaphragm 2 covers the open end of the first substrate 1, so that the vibration diaphragm 2 and the inner cavity of the first substrate 1 enclose an acoustically sealed cavity 4. It means that the acoustically sealed cavity 4 is sealed from an audio frequency and frequencies above the audio frequency, but is still capable of maintaining a pressure balance with the atmosphere at frequencies below the audio frequency by some ventilation mechanism.

Of course, for those skilled in the art, the acoustically sealed cavity 4 is not completely sealed due to the process reason. The phenomena of a non-airtight seal at a connection position and the like may exist, and the seal is also airtight at the audio frequency and the frequencies above the audio frequency, and is capable of maintaining the pressure balance with the atmosphere at the frequencies below the audio frequency.

In a specific embodiment of the present disclosure, the vibration diaphragm 2 is provided with a pressure relief hole 10 communicated with the acoustically sealed cavity 4 and an ambient environment, and the pressure relief hole 10 is an acoustically sealed hole. Of course, for those skilled in the art, the acoustically sealed pressure relief hole 10 may also be disposed in the first substrate 1 or in the spacing portion 3, which will not be explained herein.

Since the acoustically sealed cavity 4 is sealed at the audio frequency and the frequencies above the audio frequency, the air in the acoustically sealed cavity 4 will be squeezed when the vibration diaphragm 2 vibrates. At this point, the elasticity Ka of the air in the acoustically sealed cavity 4 is much larger than the mechanical elasticity Kb of the vibration diaphragm. Therefore, the air elasticity Ka in the acoustically sealed cavity 4 dominates the sensitivity of the entire microphone. When the microphone is manufactured, the consistency of parameters of the acoustically sealed cavity is easy to control, so that the consistency of the sensitivity of the microphone can be ensured.

The microphone according to the present disclosure may be in an arrangement manner in which the vibration diaphragm is provided on an upper side and the cantilever is provided on the lower side, or the arrangement manner in which the vibration diaphragm is provided on the lower side and the cantilever is provided on the upper side.

In a specific embodiment of the disclosure, the cantilever 5 is located below the vibration diaphragm 2. Referring to FIG. 1, one end of the cantilever 5 may be connected to the first substrate 1. The other end of the cantilever 5 may extend toward the central direction of the vibration diaphragm 2 and be suspended above the acoustically sealed cavity 4. An edge of the vibration diaphragm 2 is supported above the cantilever 4 by the spacing portion 3, such that the vibration diaphragm 2, the spacing portion 3 and the end position of the cantilever 5 and the inner cavity of the first substrate 1 enclose the acoustically sealed cavity 4.

In another specific embodiment of the disclosure, the cantilever 5 may also be disposed above the vibration diaphragm 2. An edge of the vibration diaphragm 2 may be fixed to the first substrate 1, such that the vibration diaphragm 2 and the inner cavity of the first substrate 1 enclose the acoustically sealed cavity 4. One end of the cantilever 5 is supported above the vibration diaphragm 2 by the spacing portion 3, and the other end of the cantilever 5 extends toward the central direction of the vibration diaphragm 2 and is suspended.

Preferably, the cantilever 5 may comprise one cantilever, one end of which is directly or indirectly connected to the first substrate 1, and the other end of which extends toward the central direction of the vibration diaphragm 2 and is suspended. The cantilever 5 may comprise a plurality of cantilevers, and the plurality of cantilevers 5 are evenly distributed along the circumferential direction of the first substrate 1.

Preferably, the cantilever 5 spans across the entire acoustically sealed cavity 4, and both ends of the cantilever 5 are directly or indirectly connected to the first substrate 1. In this case, the cantilever 5 may comprise one, two or more cantilevers 5, and these cantilevers may be disposed in an intersecting manner. For example, when two cantilevers 5 are disposed, the two cantilevers 5 may be disposed in the intersecting manner.

Figure 2:
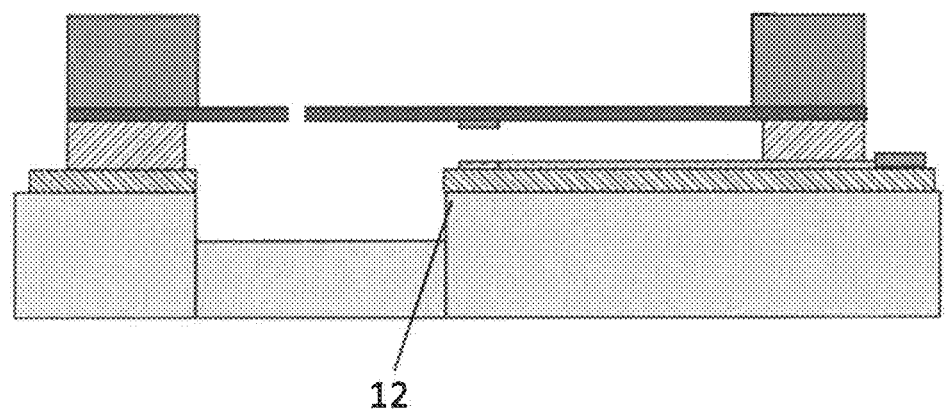
FIG. 2 is a cross-sectional view of a second embodiment of the microphone of the present disclosure.
Figure 3:
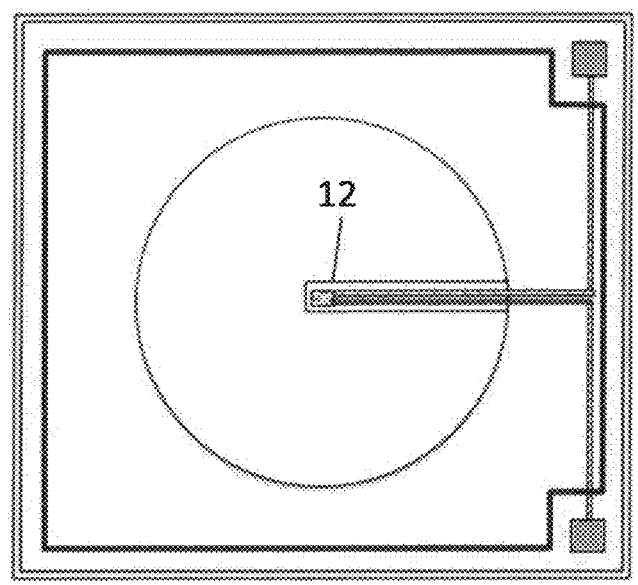
FIG. 3 is a top view of FIG. 2.

Preferably, when the cantilever 5 is disposed below the vibration diaphragm 2, in order to ensure the stability of the cantilever 5, a support portion 12 for supporting the cantilever 5 is formed in the inner cavity of the first substrate 1, referring to FIG. 2 and FIG. 3. The support portion 12 is shaped and sized to match with the cantilever 5, such that the support portion 12 does not block the inner cavity 4 of the first substrate 1 excessively. The support portion 12 may be integrated with the first substrate 1, and the support portion 12 is formed together with the first substrate 1 when the inner cavity is formed in the first substrate by etching or other methods well known to those skilled in the art.

In order to increase the sensitivity of the microphone according to the present disclosure, the microphone may adopt a high-sensitivity detection member. In a specific embodiment of the present disclosure, the high-sensitivity detection member may adopt a magnetoresistive sensor 6, such as a giant magnetoresistive sensor (GMR) or a tunnel magnetoresistive sensor (TMR), which outputs an electrical signal according to a magnetic field change. By using the high-sensitivity magnetoresistive sensor to obtain the detected electrical signal, the influence on the overall sensitivity of the microphone caused by the rigidity of the vibration diaphragm can be compensated, thereby ensuring the acoustic performance of the thin and light microphones.

Figure 4:
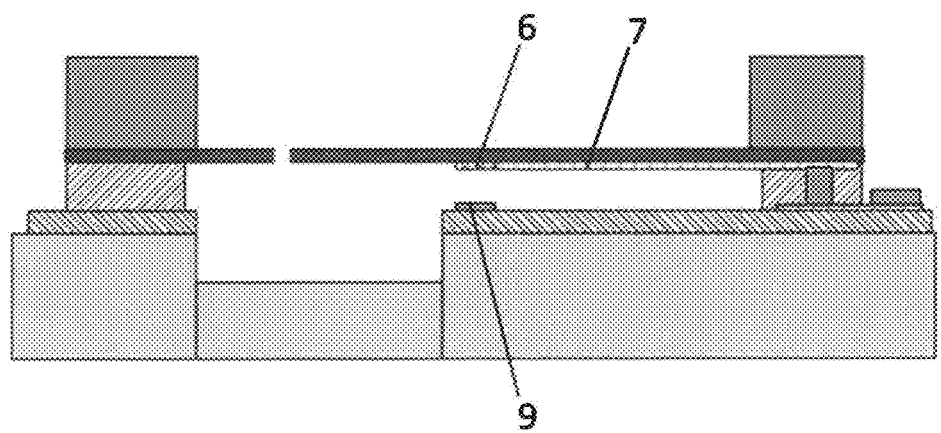
FIG. 4 is a cross-sectional view of a third embodiment of the microphone of the present disclosure.

Referring to FIG. 4, a magnetic film 9 is provided at an end of the cantilever 5 on one side adjacent to the vibration diaphragm 2, and the magnetic film 9 may directly adopt a magnetic material or the film may be magnetized after the film is formed. In a specific embodiment of the present disclosure, the magnetic film 9 may adopt a CoCrPt or CoPt material.

The magnetic film 9 may be formed on the cantilever 5 by depositing or other methods well known to those skilled in the art. Specifically, in the manufacturing, a base layer may be deposited on the first substrate 1 at first, and the base layer may be selected from, for example, silicon nitride, single crystal silicon or silicon dioxide. The cantilever 5 is formed by patterning the base layer, then the magnetic film 9 is formed on the cantilever 5 by depositing and patterning treatment, and finally the first substrate 1 is etched to form the inner cavity.

The magnetoresistive sensor 6 is provided on one side of the vibration diaphragm 2 adjacent to the cantilever 5, and the magnetoresistive sensor 6 is disposed by corresponding to the magnetic film 9 located on the cantilever 5.

In order to introduce the electrical signal of the magnetoresistive sensor 6 onto the first substrate 1, a lead portion 7 may be provided on the vibration diaphragm 2, one end of the lead portion 7 is connected to the magnetoresistive sensor 6, and the other end of the lead portion 7 extends on the vibration diaphragm 2 to the position of the spacing portion 3, and is connected to a bonding pad 8 or the circuit layout of the first substrate 1 by a conductive structure disposed in the spacing portion 3.

When the vibration diaphragm 2 is subjected to an external sound pressure, the vibration diaphragm 2 is deformed toward or away from the cantilever 5, and in this case, the magnetoresistive sensor 6 on the vibration diaphragm 2 is moved toward or away from the magnetic film 9, so that the magnetoresistive sensor 6 can sense the magnetic field change, thereby outputting a varying electrical signal, and realizing the acoustic-electric conversion.

Preferably, the magnetoresistive sensor 6 is also provided on one side of the vibration diaphragm 2 away from the cantilever 5. Although the vibration diaphragm 2 is interposed between the magnetoresistive sensor 6 and the magnetic film 9, the magnetic field of the magnetic film 9 can still pass through the vibration diaphragm 2 and be sensed by the magnetoresistive sensor 6, thus the performance of the microphone is not affected.

The magnetic film 9 may also be provided on the vibration diaphragm 2 and the magnetoresistive sensor 6 may be provided on the cantilever 5. Referring to the embodiment shown in FIG. 1, the magnetoresistive sensor 6 is disposed on the cantilever 5 at one side adjacent to the vibration diaphragm 2, and the magnetic film 9 is disposed on the vibration diaphragm 2 at one side adjacent to the cantilever 5. The position of the magnetoresistive sensor 6 corresponds to the position of the magnetic film 9, such that the magnetoresistive sensor 6 can be in a position high sensitive to magnetic field change.

In an optional embodiment of the present disclosure, the vibration diaphragm 2 may adopt a composite structure, and the magnetoresistive sensor 6 or the magnetic film 9 may be disposed in the composite structure of the vibration diaphragm 2, which will not be specifically explained herein.

It should be noted that for a high sensitive detection of each embodiment of the present disclosure, the magnetoresistive sensor 6 and the magnetic film 9 may each comprise one or a plurality of magnetoresistive sensors 6 and magnetic films 9 arranged in an array to improve the detection. For example, when a plurality of cantilevers 5 is disposed, one magnetoresistive sensor 6 or magnetic film 9 may be provided on each of the cantilevers 5, which will not be specifically explained herein.

The microphone according to the present disclosure may be manufactured by a bonding process. Referring to FIG. 1, for example, the cantilever 5, the magnetoresistive sensor 6 on the cantilever 5, and part of the spacing portion are formed on the first substrate 1 in advance, and the other part of the spacing portion, the vibration diaphragm 2 and the magnetic film 9 on the vibration diaphragm 2 are formed on the second substrate 11. After the first substrate and the spacing portion on the second substrate are bonded together, the second substrate 11 is processed. Thus, the microphone according to the present disclosure is obtained.

The microphone according to the present disclosure may adopt a conventional package structure, for example, the package structure enclosed by a circuit board and a shell is disposed. The microphone is mounted in the package structure to form a traditional top package structure or bottom package structure, and is finally mounted on an external terminal in the form of a microphone module.

The present disclosure has been explained in detail by the preferred embodiments. However, variations and additions on the various embodiments are obvious for those ordinary skilled in the art by reading the foregoing context. The applicant intends to include all such variations and additions within the scope of claims of the present disclosure.

Similar numbers refer to similar elements in the text. For the sake of clarity, some of the lines, layers, elements, components or features may be enlarged in the drawings.

The terms used herein are merely for the purpose of illustrating specific embodiments rather than limiting the present disclosure. Unless otherwise defined, all terms (including technical terms and scientific terms) used herein are the same as those understood by the ordinary skilled in the art of the present disclosure.

The invention claimed is:

1. A microphone, comprising:
   a first substrate having an inner cavity with an open end;
   a vibration diaphragm and at least one cantilever provided to the first substrate and suspended above the inner cavity, the vibration diaphragm and the inner cavity enclosing an acoustically sealed cavity;
   a spacing portion configured to separate the cantilever from the vibration diaphragm; and
   a detector provided to the vibration diaphragm and the cantilever, being and configured to output an electrical signal representing a deformation of the vibration diaphragm.

2. The microphone according to claim 1, wherein the cantilever is located below the vibration diaphragm, an end of the cantilever is fixed to the first substrate, and the vibration diaphragm is supported above the cantilever by the spacing portion.

3. The microphone according to claim 1, wherein the cantilever is located above the vibration diaphragm, an edge of the vibration diaphragm is fixed to the first substrate, and an end of the cantilever is supported above the vibration diaphragm by the spacing portion.

4. The microphone according to claim 1, wherein a first end of the cantilever is directly or indirectly connected to the first substrate, and a second end of the cantilever extends toward a central direction of the vibration diaphragm and is suspended in air.

5. The microphone according to claim 1, wherein a first end and a second end of the cantilever are directly or indirectly connected to the first substrate.

6. The microphone according to claim 1, wherein the cantilever comprises at least two cantilevers disposed in an intersecting manner.

7. The microphone according to claim 1, wherein a support portion for supporting the cantilever is formed in the inner cavity of the first substrate, the support portion being shaped and sized to match with the cantilever.

8. The microphone according to claim 1, wherein the detector comprises a magnetic film and a magnetoresistive sensor cooperating with the magnetic film, the magnetic film being provided on a first of the vibration diaphragm and the cantilever, and the magnetoresistive sensor being provided on a second of the vibration diaphragm and the cantilever, and being configured to sense a magnetic field change of the magnetic film during a vibration of the vibration diaphragm to output a varying electrical signal.

9. The microphone according to claim 8, wherein the magnetoresistive sensor is a giant magnetoresistive sensor or a tunnel magnetoresistive sensor.

10. The microphone according to claim 1, further comprising a pressure relief hole communicating the acoustically sealed cavity with an ambient environment, the pressure relief hole being an acoustically sealed hole.

* * * * *